United States Patent
Saitoh et al.

(10) Patent No.: US 7,861,683 B2
(45) Date of Patent: Jan. 4, 2011

(54) DIAGNOSIS DEVICE FOR VEHICLE

(75) Inventors: Soichi Saitoh, Nagoya (JP); Eijirou Yamada, Hekinan (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/409,709

(22) Filed: Mar. 24, 2009

(65) Prior Publication Data

US 2009/0241884 A1 Oct. 1, 2009

(30) Foreign Application Priority Data

Apr. 1, 2008 (JP) .............................. 2008-094522

(51) Int. Cl.
*F02N 11/10* (2006.01)

(52) U.S. Cl. .............................. 123/179.4; 123/198 D; 701/107; 701/113

(58) Field of Classification Search ............. 123/179.3, 123/179.4, 481, 198 D, 198 DB; 701/107, 701/113

See application file for complete search history.

(56) References Cited

U.S. PATENT DOCUMENTS

| | | | | |
|---|---|---|---|---|
| 4,590,566 A | * | 5/1986 | Takahashi | 701/114 |
| 7,312,968 B2 | * | 12/2007 | Kahara et al. | 361/93.1 |
| 7,774,110 B2 | * | 8/2010 | Sago | 701/29 |
| 2007/0093948 A1 | * | 4/2007 | Sago | 701/29 |
| 2009/0217897 A1 | * | 9/2009 | Hartmann et al. | 123/179.3 |

FOREIGN PATENT DOCUMENTS

| | | | | |
|---|---|---|---|---|
| EP | 2055916 A2 | * | 5/2009 | |
| EP | 2055935 A1 | * | 5/2009 | |
| JP | 58-23253 | * | 2/1983 | |
| JP | 58-23254 | * | 2/1983 | |
| JP | 2002-349404 | * | 12/2002 | |
| JP | 4001092 | | 8/2007 | |
| JP | 2009-243452 | * | 10/2009 | |

\* cited by examiner

*Primary Examiner*—Hai H Huynh
(74) *Attorney, Agent, or Firm*—Nixon & Vanderhye P.C.

(57) ABSTRACT

After an engine automatic stop processing is started, a diagnosis of a starter is started at a time of t1 when an engine speed drops to a diagnosis starting speed. Before the engine speed drops to the lower limit speed at which an engine can be restarted without being cranked by the starter, the diagnosis of the starter is conducted. In the diagnosis of the starter, it is determined whether the starter is faulty based on a current passing through the starter when a relay is turned off to stop energization of the starter before the starter actually rotates after the relay is turned on. Thereby, a malfunction of the starter can be detected before the engine is automatically stopped. It is avoided to automatically stop the engine which is incapable of being automatically restarted due to the malfunction of the starter.

11 Claims, 5 Drawing Sheets

DIAGNOSIS DEVICE FOR VEHICLE

CROSS-REFERENCE TO RELATED APPLICATION

This application is based on Japanese Patent Application No. 2008-94522 filed on Apr. 1, 2008, the disclosure of which is incorporated herein by reference.

FIELD OF THE INVENTION

The present invention relates to a diagnosis device for a vehicle, which determines whether an actuator mounted on the vehicle is faulty.

In order to improve a fuel economy and reduce an exhaust emission, a recent vehicle provided with an internal combustion engine has an engine automatic stop/start control system, which is referred to as an idle stop control system. In this engine automatic stop/start control system, when a driver decelerates the vehicle and a specified automatic stop condition is established, the engine is automatically stopped. Then, when the driver tries to accelerate the vehicle and a specified automatic start condition is established, the engine is automatically restarted by a starter cranking the engine.

A vehicle provided with such an engine automatic stop/start control system, as shown in Japanese Patent No. 4001092, has a manual start circuit which energizes a starter by turning on an ignition switch at a time of initial starting of the engine, and an automatic start circuit which energizes the starter by turning on an idle stop relay at a time of starting engine automatically. When the ignition switch is turned on, the starter is energized by the manual start circuit. After a specified time has elapsed, the manual start circuit is switched to the automatic start circuit in order to energize the starter by the automatic start circuit, whereby a diagnosis is performed to determine whether the automatic start circuit of the starter is faulty at the initial starting of the engine. Thus, it can be avoided that the engine can not be restarted automatically after the engine is automatically stopped.

However, in a system where a diagnosis of an automatic start circuit of starter is performed at an initial starting of an engine, if the starter becomes faulty after the initial engine starting has completed, a malfunction of the starter can not be found out until an automatic start control of engine is performed after the engine is automatically stopped. Thus, it can not be avoided that the engine can not be automatically started due to the malfunction of the starter.

SUMMARY OF THE INVENTION

The present invention is made in view of the above matters, and it is an object of the present invention to provide a diagnosis device for a vehicle, which can detects a malfunction of an actuator mounted on the vehicle before the actuator is required to be operated.

Generally, in an actuator having a coil to be energized (for example, an actuator driven by an electric motor), a time delay exists from a time of an energization to the coil until the actuator actually operates.

According to the present invention, a diagnosis device for a vehicle is provided with a function of switching a relay provided between an actuator and an electric power supply to control an energization of the actuator. The diagnosis device includes a diagnosis means for determining whether the actuator is faulty based on a voltage applied to the actuator and/or an electric current passing through the actuator when the relay is turned off before the actuator actually operates after the relay has been turned on.

After the relay is turned on to start an energization of the actuator, the actuator operates. Before the actuator actually operates, the relay is turned off to stop electric current passing through the actuator. An electric current and/or a voltage applied to the actuator are detected at a time when the relay is turned off. A diagnosis of the actuator is performed based on the detected current and/or voltage without operating the actuator. Thereby, a malfunction of an actuator can be detected before the actuator is required to be operated.

The diagnosis means determines that a driving circuit of the actuator has a malfunction of breaking or a short circuit to ground when the electric current passing through the actuator right before the relay is turned off after the relay has been turned on is less than a specified value. That is, when the current passing through the actuator is very small even after the relay is turned on, it can be determined that a driving circuit of the actuator has a malfunction of breaking or a short circuit to ground. Thereby, a reason for the failure of the actuator can be identified so that a repair of the actuator can be easily conducted.

According to another aspect of the present invention, a diagnosis device for a vehicle is provided with a function of performing an automatic stop/start control in which an internal combustion engine is automatically stopped when a specified automatic stop condition is established and the internal combustion engine is automatically started when a specified automatic start condition is established. Further, the diagnosis device for a vehicle is provided with a starter cranking the internal combustion engine to automatically start the internal combustion engine. The diagnosis device for a vehicle includes a diagnosis means for determining whether the starter is faulty before the internal combustion engine is stopped. Even if the internal combustion engine becomes incapable of being automatically started due to a malfunction of the starter after the engine is started, the malfunction of the starter can be detected, so that it can be avoided that the engine incapable of being automatically started is automatically stopped.

According to another aspect of the present invention, a diagnosis device for a vehicle is provided with a function of performing an automatic stop/start control in which an internal combustion engine is automatically stopped when a specified automatic stop condition is established while the vehicle is running and the internal combustion engine is automatically started when a specified automatic start condition is established. Further, the diagnosis device for a vehicle is provided with a function of switching a relay provided between a starter cranking the internal combustion engine to automatically start the internal combustion engine and an electric power supply in order to control an energization of the starter. The diagnosis device for a vehicle includes a diagnosis means for determining the starter is faulty based on a voltage applied to the starter and/or an electric current passing through the starter when the relay is turned off before the starter actually operates after the relay has been turned on by a time when an engine speed drops to a lower limit speed at which the internal combustion engine can be restarted without being cranked by the starter. Furthermore, the diagnosis device for a vehicle includes a means for prohibiting the automatic stop/start control, restarting the internal combustion engine without cranking by the starter, and notifying a driver of a malfunction of the starter when the diagnosis means determines that the starter is faulty. Thus, it can be avoided that the internal combustion engine which become incapable of being automatically started due to a malfunction of the starter while the vehicle is running is automatically stopped.

BRIEF DESCRIPTION OF THE DRAWINGS

Other objects, features and advantages of the present invention will become more apparent from the following description made with reference to the accompanying drawings, in which like parts are designated by like reference numbers and in which.

DETAILED DESCRIPTION OF EMBODIMENTS

An embodiment of the present invention will be described hereinafter.

Figure 1:
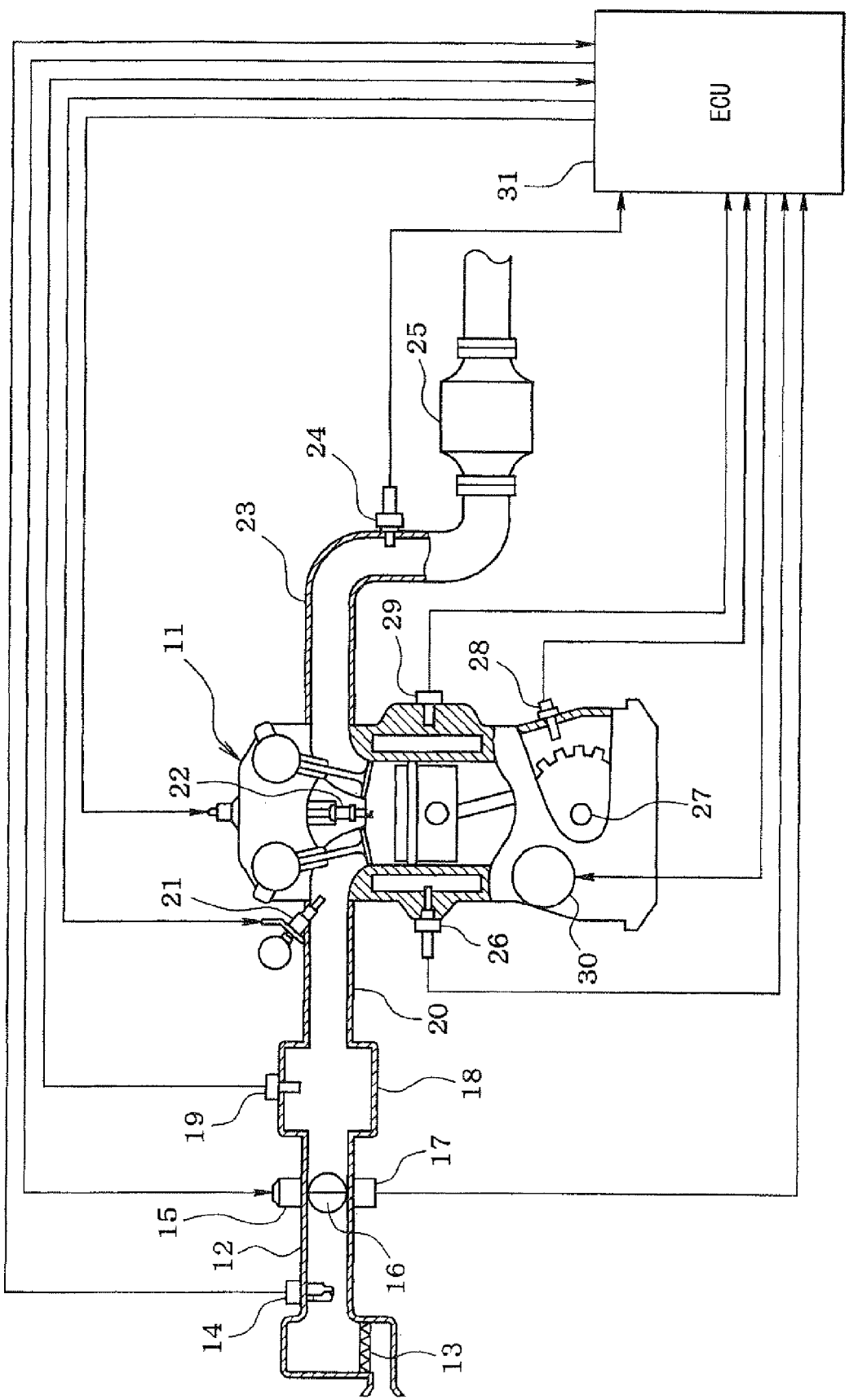
FIG. 1 is a schematic view of an engine control system according to an embodiment of the present invention.

Referring to FIG. 1, an engine control system is explained. An air cleaner 13 is arranged upstream of an intake pipe 12 of an internal combustion engine 11. An airflow meter 14 detecting an intake air flow rate is provided downstream of the air cleaner 13. A throttle valve 16 driven by a DC-motor 15 and a throttle position sensor 17 detecting a throttle position (throttle opening degree) are provided downstream of the air flow meter 14.

A surge tank 18 including an intake air pressure sensor 19 is provided downstream of the throttle valve 16. The intake air pressure sensor 19 detects intake air pressure. An intake manifold 20 which introduces air into each cylinder of the engine 11 is provided downstream of the intake pipe 12, and the fuel injector 21 which injects the fuel is provided at a vicinity of an intake port of the intake manifold 20 of each cylinder. A spark plug 22 is mounted on a cylinder head of the engine 11 corresponding to each cylinder to ignite air-fuel mixture in each cylinder.

An exhaust gas sensor (an air fuel ratio sensor, an oxygen sensor) 24 which detects an air-fuel ratio of the exhaust gas is respectively provided in each exhaust pipe 23, and a three-way catalyst 25 which purifies the exhaust gas is provided downstream of the exhaust gas sensor 24.

A coolant temperature sensor 26 detecting a coolant temperature and a knock sensor 29 detecting a knocking of the engine are disposed on a cylinder block of the engine 11. A crank angle sensor 28 is installed on a cylinder block to output crank angle pulses when a crank shaft 27 rotates a predetermined angle. Based on this crank angle pulses, a crank angle and an engine speed are detected.

The engine 11 is provided with a starter 30 cranking the crank shaft 27 to start the engine 11. The starter 30 is comprised of a DC motor (not shown) having a coil. When the coil is energized, the DC motor starts to rotate.

The outputs of the sensors are inputted to an electronic control unit (ECU) 31. The ECU 31 includes a microcomputer which executes an engine control program stored in a Read Only Memory (ROM) to control a fuel injection quantity of a fuel injector 21 and an ignition timing of a spark plug 22 according to an engine running condition.

Figure 2:
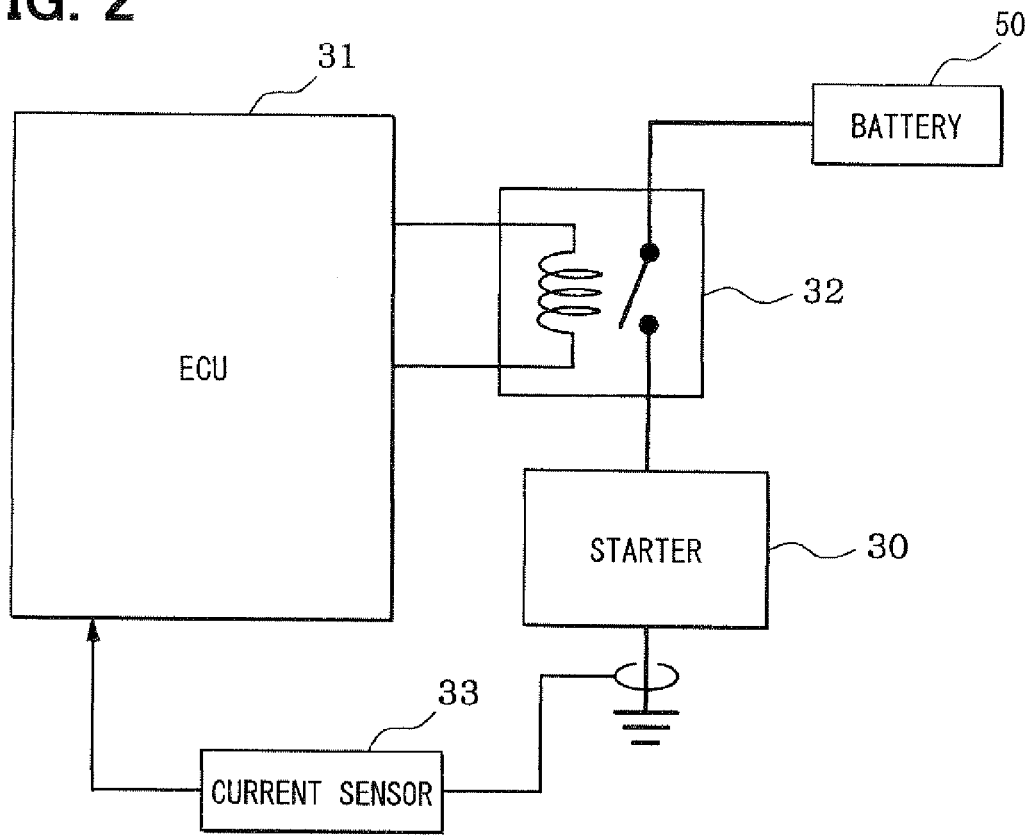
FIG. 2 is a chart showing a circuit of a power supply system of a starter.

As shown in FIG. 2, a relay 32 is electrically provided between the starter 30 and a battery (electric power supply) 50. The ECU 31 controls on-off condition of the relay 32. When the relay 32 is turned on, the starter 30 is energized. When the relay 32 is turned off, the starter 30 is deenergized. A current sensor 33 detects electric current passing through the starter 30.

The ECU 31 performs an automatic stop/start control, which is referred to as an idle stop control, by executing an automatic stop/start routine (not shown). In the automatic stop/start control, when a driver conducts a deceleration operation (full close of accelerator, breaking operation, and the like), or when the vehicle is stopped, an automatic stop condition is established to stop a fuel combustion (fuel injection and/or fuel ignition), so that the engine 11 is automatically stopped. At this moment, after the fuel injection is stopped, the ignition may be performed by a specified time and then the ignition may be stopped. Then, when a deceleration demand is cancelled while a vehicle is running, or when a driver conducts a preparation operation for starting (release of a breaking, shift lever operation, and the like) or a starting operation (stepping an accelerator) while the vehicle is stopped, an automatic start condition is established to energize the starter 30, crank the engine 11, and start fuel injection and fuel ignition, so that the engine 11 is automatically restarted.

Figure 5:
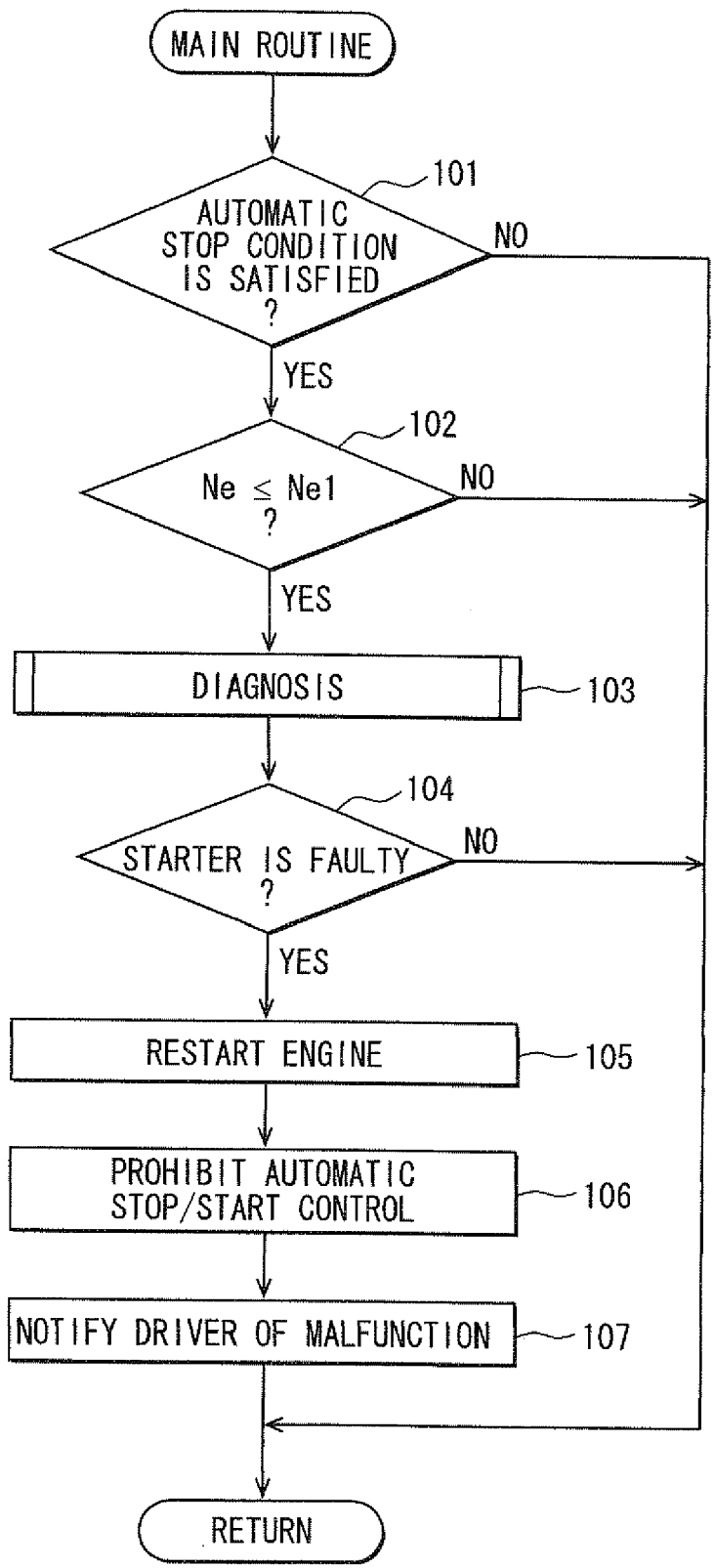
FIG. 5 is a flowchart showing a diagnosis main routine.
Figure 6:
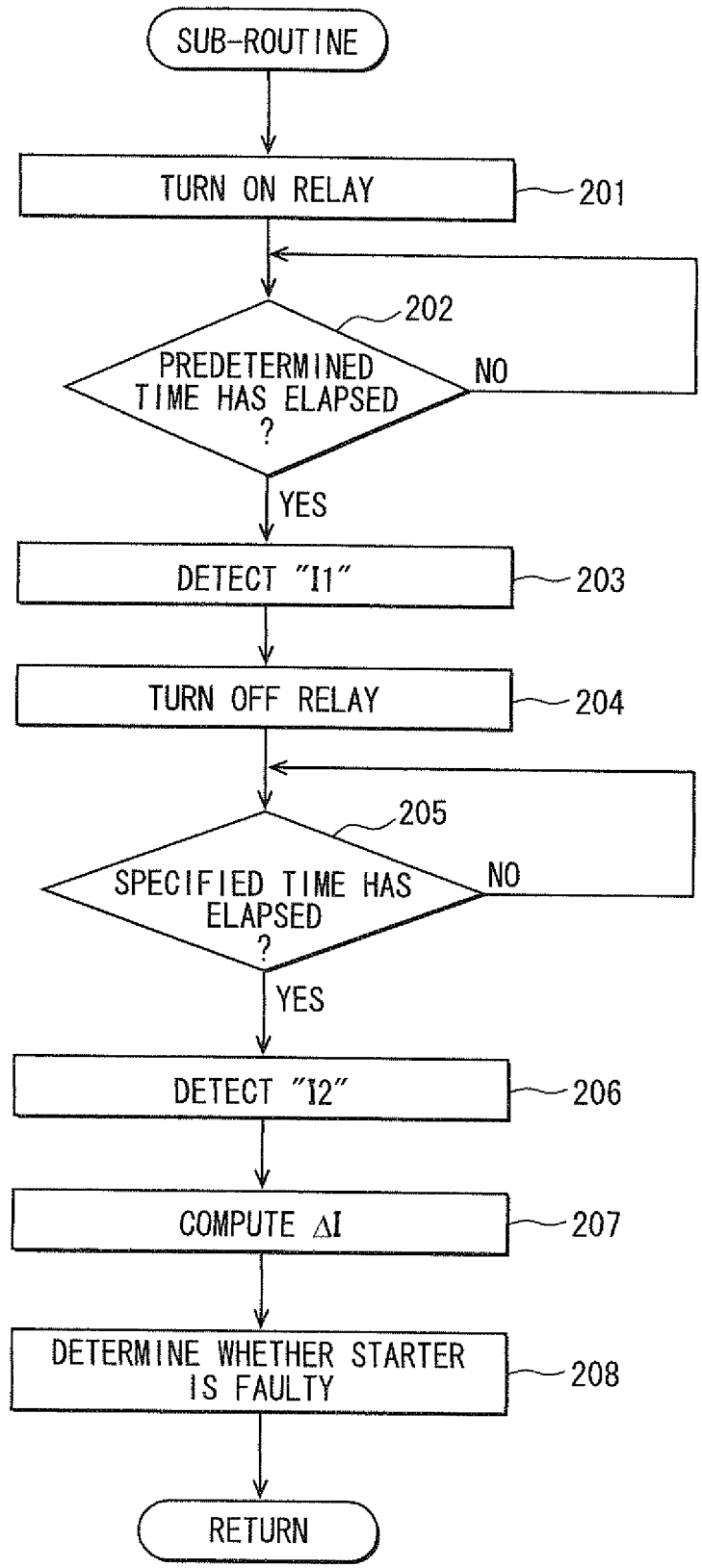
FIG. 6 is a flowchart showing a diagnosis sub-routine.

Furthermore, the ECU 31 performs diagnosis routines for the starter 30 shown in FIGS. 5 and 6 in order to avoid a situation where the engine 11 incapable of being restarted due to a malfunction of the starter 30 is automatically stopped.

Figure 3:
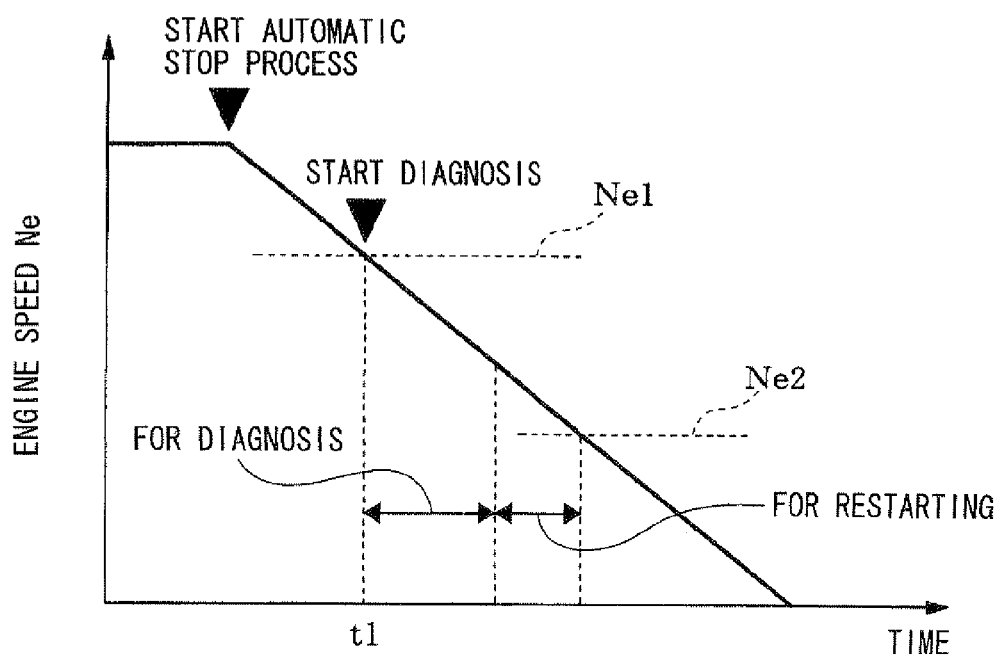
FIG. 3 is a time chart for explaining a diagnosis of the starter.

As shown in FIG. 3, after the automatic stop condition of the engine 11 is established to start the automatic stop process, when an engine speed Ne drops to a diagnosis starting speed Ne1 at a time of t1, a diagnosis of the starter 30 is started. The diagnosis starting speed Ne1 is higher than a lower limit speed Ne2 (for example, 400 rpm) at which the engine 11 can be restarted without being cranked by the starter 30. A time period during which the engine speed Ne decreases from Ne1 to Ne2 is greater than or equal to a time necessary for diagnosing the starter 30 and restarting the engine 11. Thus, before the engine speed Ne drops to the lower limit speed Ne2, the diagnosis of the starter 30 can be performed.

Figure 4:
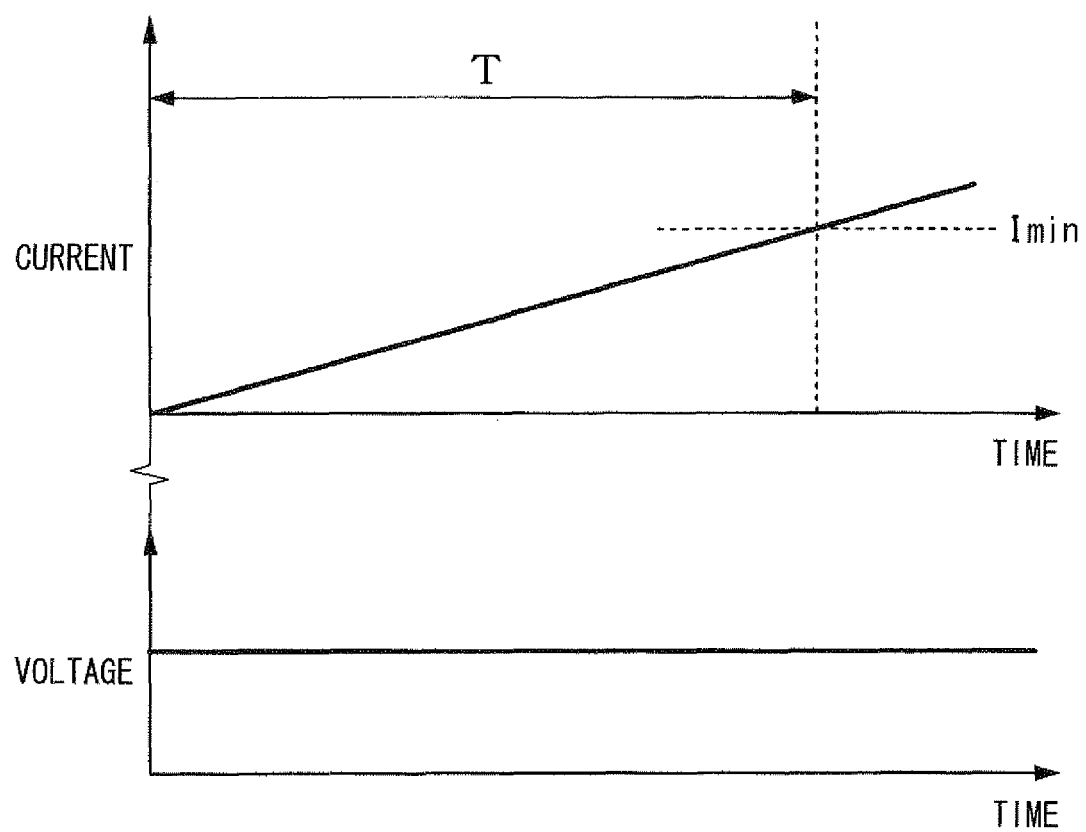
FIG. 4 is a chart showing a characteristic of electric current and voltage when the starter is energized.

Generally, as shown in FIG. 4, the starter 30 starts to rotate when an electric current passing through the coil reaches a predetermined value "Imin" which is a minimum current value for starting the starter 30. Thus, a time delay "T" exists from a time of starting energization of starter 30 to a time of actual rotation of the starter 30.

According to the present embodiment, based on the above characteristics, the diagnosis of the starter 30 is performed. After the relay 32 is turned on to start the energization of the starter 30, the starter 30 rotates. Before the starter actually rotates, the relay 32 is turned off to stop electric current passing through the starter 30. The current sensor 33 detects the electric current passing through the starter 30 at a time when the relay 32 is turned off. Based on the detected current, a diagnosis of the starter 30 is performed without rotating the starter 30.

When it is determined that the starter 30 is faulty, fuel injection and fuel ignition are performed to restart the engine 11 without cranking by the starter 30 by the time when the engine speed Ne drops to the lower limit speed Ne2 Further, the automatic stop/start control is prohibited, and the malfunction of the starter 30 is notified to the driver.

The above described diagnosis of the starter 30 is performed by the ECU 31 according to the diagnosis routines shown in FIGS. 5 and 6.

[Diagnosis Main Routine]

A diagnosis main routine shown in FIG. 5 is executed at specified intervals while the ECU 31 is ON. In Step S101, it is determined whether the automatic stop condition of the engine 11 is satisfied. The automatic stop condition is satisfied when a driver conducts a deceleration operation (full close of accelerator, breaking operation, and the like) or when the vehicle is stopped. When the answer is No in step 101, the routine is finished without performing the subsequent steps.

When the answer is Yes in step 101, the procedure proceeds to step 102. In step 102, the computer determines whether the engine speed Ne is lower than or equal to the diagnosis starting speed Ne1 after the automatic stop process is started. The diagnosis starting speed Ne1 is higher than a lower limit speed Ne2 (for example, 400 rpm) at which the engine 11 can be restarted without cranking by the starter 30. A time period during which the engine speed Ne decreases from Ne1 to Ne2 is greater than or equal to a time necessary for diagnosing the starter 30 and restarting the engine 11.

When the computer determines that the engine speed Ne drops lower than or equal to the speed Ne1 in step 102, the procedure proceeds to step 103 in which a diagnosis sub-routine shown in FIG. 6, which will be described later, is performed to start the diagnosis of the starter 30. Thus, before the engine speed Ne drops to the lower limit speed Ne2, the diagnosis of the starter 30 is conducted.

Then, the procedure proceeds to step 104 in which the computer determines whether the starter 30 is faulty based on the diagnosis result in step 103. When the answer is No in step 104, the routine is finished.

When the answer is Yes in step 104, the procedure proceeds to step 105 in which fuel injection and fuel ignition are performed to restart the engine 11 without cranking by the starter 30 by the time when the engine speed Ne drops to the lower limit speed Ne2.

Then, the procedure proceeds to step 106 in which the automatic stop/start control is prohibited. In step 107, a warning lump (not shown) on an instrumental panel is turned on to notify the driver of the malfunction of the starter 30. This malfunction information of the starter 30 is stored in a backup RAM (not shown) of the ECU 31. In the present embodiment, the process in step 106 corresponds to an automatic stop/start control prohibiting means, and the process in step 107 corresponds to a warning means.

[Diagnosis Sub-routine]

The diagnosis sub-routine shown in FIG. 6 corresponds to a diagnosis means. In step 201, the relay 32 is turned on to energize the starter 30. In step 202, the computer determines whether a predetermined time has elapsed after the relay 32 is turned on to energize the starter 30. The predetermined time is set shorter than the time delay "T" shown in FIG. 4.

When the answer is Yes in step 202, the procedure proceeds to step 203 in which the current sensor 33 detects an electric current "I1" passing through the starter 30 after the relay 32 is turned on.

Then, the procedure proceeds to step 204 in which the relay 32 is turned off to stop the energization of the starter 30 before the starter 30 actually rotate. In step 205, the computer determines whether a specified time has elapsed after the relay 32 is turned off to stop the energization of the starter 30. The specified time is a time period enough for decreasing the current passing through the starter 30 after the relay 32 is turned off.

When the answer is Yes in step 205, the procedure proceeds to step 206 in which the current sensor 33 detects an electric current "I2" passing through the starter 30 after the relay 32 is turned off.

Then, the procedure proceeds to step 207 in which the computer computes a differential current $\Delta I$ between the current "I1" and the current "I2" ($\Delta I = I1 - I2$). Then, the procedure proceeds to step 208 in which the computer determines whether the starter 30 is faulty.

Specifically, the diagnosis of the starter 30 is formed as follows:

(1) When the current "I1" is less than a specified value, that is, when the current "I1" is very small even after the relay 32 is turned on, the computer determines that a driving circuit of the starter 30 has a malfunction of breaking or a short circuit to ground.

(2) When the differential current $\Delta I$ is less than a specified value and when the current "I1" is not less than a specified value, the computer determines that the driving circuit of the starter 30 short-circuits to the battery 50.

(3) When the differential current $\Delta I$ is less than a specified value and when the current "I1" is less than a specified value, the computer determines that the driving circuit of the starter 30 has a breaking.

In the cases of (1)-(3), the computer determines that the starter 30 is faulty, In the other cases, the computer determines that the starter 30 is normal.

After the relay 32 is turned on to start the energization of the starter 30, the starter 30 rotates. Before the starter actually rotates, the relay 32 is turned off to stop electric current passing through the starter 30. The current sensor 33 detects the electric current passing through the starter 30 at a time when the relay 32 is turned off. According to the present embodiment, a diagnosis of the starter 30 is performed based on the detected current without rotating the starter 30. Since the diagnosis of the starter 30 is performed before the engine 11 is automatically stopped, even if the starter 30 becomes faulty during an engine driving, the malfunction of the starter 30 can be detected before the engine is automatically stopped, so that it can be avoided to automatically stop the engine 11 which becomes incapable of being automatically started due to the malfunction of the starter 30.

Furthermore, since the diagnosis of the starter 30 is performed by the time when the engine speed Ne drops to the lower limit speed Ne2, the engine 11 can be restarted by performing fuel injection and fuel ignition without cranking by the starter 30 in a case that the computer determines the starter 30 is faulty.

Furthermore, according to the present embodiment, since the automatic stop/start control is prohibited in a case that it is determined that the starter 30 is faulty, it can be avoided to automatically stop the engine 11 which becomes incapable of being automatically started due to the malfunction of the starter 30 while the engine 11 is running.

The warning lump (not shown) on an instrumental panel is turned on to notify the driver of the malfunction of the starter 30, whereby the driver is encouraged to repair the starter 30.

According to the present embodiment, a reason for the failure of the starter 30 can be identified based on the current "I1" and the current "I2", a repair of the starter 30 can be easily conducted.

In the above embodiment, the diagnosis of the starter 30 is performed during a decrease in engine speed before the engine 11 is automatically stopped. Alternatively, the diagnosis of the starter 30 may be performed while the engine 11 is normally running.

The diagnosis of the starter 30 may be performed based on voltage applied to the starter 30 when the relay 32 is turned off before the starter actually rotates after the relay is turned on.

Specifically, when the voltage applied to the starter 30 is approximately equal to the battery voltage irrespective of ON/OFF state of the relay 32, the computer determines that the driving circuit of the starter 30 short-circuits to the battery 50.

When the voltage applied to the starter 30 with the relay 32 turned on is less than a specified value, that is, when the voltage applied to the starter 30 is very low without respect to a starting of an energization of the starter 30, the computer determines that the driving circuit of the starter 30 is broken.

Alternatively, the diagnosis of the starter 30 may be performed based on the current passing through the starter 30 and the voltage applied to the starter 30 when the relay 32 is turned off before the starter 30 actually rotates after the relay 32 is turned on.

The present invention can be applied to a diagnosis of a driving motor for a hybrid vehicle.

Furthermore, the present invention can be applied to a diagnosis of an actuator for a vehicle, such as an electric oil pump and an electric fuel pump mounted on a vehicle.

What is claimed is:

1. A diagnosis device for a vehicle provided with a function of switching a relay provided between an actuator and an electric power supply to control an energization of the actuator, the diagnosis device comprising:
   a diagnosis means for determining whether the actuator is faulty based on at least one of a voltage applied to the actuator and an electric current passing through the actuator, wherein
   the relay is turned off before the actuator is actually operated after the relay has been turned on, and
   at least one of the voltage and the electric current is detected when the relay is turned off before the actuator is actually operated after the relay has been turned on.

2. A diagnosis device for a vehicle according to claim 1, wherein
   the diagnosis means determines that a driving circuit of the actuator has a malfunction of breaking or a short circuit to ground when the electric current passing through the actuator right before the relay is turned off after the relay has been turned on is less than a specified value.

3. A diagnosis device for a vehicle according to claim 1, wherein
   the diagnosis means determines that the driving circuit of the actuator has a malfunction of a short circuit to the electric power supply when a differential current between a current passing through the actuator right before the relay is turned off after the relay has been turned on and a current passing through the actuator after the relay is turned off is not less than a specified value.

4. A diagnosis device for a vehicle according to claim 1, wherein
   the diagnosis means determines that the driving circuit of the actuator has a malfunction of breaking when a differential current between a current passing through the actuator right before the relay is turned off after the relay has been turned on and a current passing through the actuator after the relay is turned off is less than a specified value.

5. A diagnosis device for a vehicle according to claim 1, wherein
   the diagnosis means determines that the driving circuit of the actuator has a malfunction of a short circuit to the electric power supply when a voltage applied to the actuator is approximately equal to a voltage of the electric power supply irrespective of whether the relay is turned on or off.

6. A diagnosis device for a vehicle according to claim 1, wherein
   the diagnosis means determines that a driving circuit of the actuator has a malfunction of breaking or a short circuit to ground in a case that the voltage applied to the actuator is less than a specified value when the relay is turned on.

7. A diagnosis device for a vehicle provided with a function of performing an automatic stop/start control in which an internal combustion engine is automatically stopped when a specified automatic stop condition is established and the internal combustion engine is automatically started when a specified automatic start condition is established, and a starter cranking the internal combustion engine to automatically start the internal combustion engine, the diagnosis device comprising:
   a diagnosis means for determining whether the starter is faulty before the internal combustion engine is stopped after the specified automatic stop condition has been established.

8. A diagnosis device for a vehicle according to claim 7, wherein
   the diagnosis means performs a diagnosis of the starter by a time when an engine speed drops to a lower limit speed at which the internal combustion engine can be restarted without being cranked by the starter.

9. A diagnosis device for a vehicle according to claim 7, further comprising:
   a prohibit means for prohibiting the automatic stop/start control when the diagnosis means determines that the starter is faulty.

10. A diagnosis device for a vehicle according to claim 7, further comprising:
    a warning means for notifying a driver of a malfunction of the starter when the diagnosis means determines that the starter is faulty.

11. A diagnosis device for a vehicle provided with a function of performing an automatic stop/start control in which an internal combustion engine is automatically stopped when a specified automatic stop condition is established while the vehicle is running and the internal combustion engine is automatically started when a specified automatic start condition is established, and a function of switching a relay provided between a starter cranking the internal combustion engine to automatically start the internal combustion engine and an electric power supply in order to control an energization of the starter, the diagnosis device comprising:
    a diagnosis means for determining the starter is faulty based on a voltage applied to the starter and/or an electric current passing through the starter, the voltage and/or the electric current being detected when the relay is turned off before the starter actually operates after the relay has been turned on by a time when an engine speed drops to a lower limit speed at which the internal combustion engine can be restarted without being cranked by the starter; and
    a means for prohibiting the automatic stop/start control, restarting the internal combustion engine without cranking by the starter, and notifying a driver of a malfunction of the starter when the diagnosis means determines that the starter is faulty.

* * * * *